US012813307B2

(12) United States Patent
Cho et al.

(10) Patent No.: US 12,813,307 B2
(45) Date of Patent: Nov. 24, 2026

(54) FILM SUBSTRATE, SEMICONDUCTOR PACKAGE INCLUDING THE FILM SUBSTRATE, AND METHOD USING THE SEMICONDUCTOR PACKAGE

(71) Applicant: SAMSUNG ELECTRONICS CO., LTD., Suwon-si (KR)

(72) Inventors: Seung Hyun Cho, Suwon-si (KR); Jeong-Kyu Ha, Suwon-si (KR); Jae-Min Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 18/229,035

(22) Filed: Aug. 1, 2023

(65) Prior Publication Data

US 2024/0079311 A1 Mar. 7, 2024

(30) Foreign Application Priority Data

Sep. 2, 2022 (KR) ........................ 10-2022-0111088

(51) Int. Cl.

*H10W 70/67* (2026.01)
*B32B 7/12* (2006.01)
*B32B 27/06* (2006.01)
*H10W 70/685* (2026.01)
(Continued)

(52) U.S. Cl.

CPC ............. *H10W 70/688* (2026.01); *B32B 7/12* (2013.01); *B32B 27/06* (2013.01); *H10W 70/685* (2026.01); *B32B 2307/206* (2013.01); *B32B 2307/7376* (2023.05); *B32B 2307/748* (2013.01); *B32B 2457/20* (2013.01);
(Continued)

(58) Field of Classification Search

CPC . H01L 23/4985; H01L 23/49822; B32B 7/12; B32B 27/06; H10W 70/688; H10W 70/685

See application file for complete search history.

(56) References Cited

U.S. PATENT DOCUMENTS

| | | | |
|---|---|---|---|
| 6,425,971 B1 | 7/2002 | Silverbrook | |
| 8,309,219 B2 | 11/2012 | Hwang et al. | |
| 2019/0189561 A1* | 6/2019 | Rusli | H01L 24/17 |

(Continued)

FOREIGN PATENT DOCUMENTS

| | | |
|---|---|---|
| JP | 2003-332280 A | 11/2003 |
| JP | WO2015/029871 A1 | 3/2015 |

(Continued)

OTHER PUBLICATIONS

Improved Machine Translation of JP 2018-44148.*

(Continued)

*Primary Examiner* — Suberr L Chi
(74) *Attorney, Agent, or Firm* — Sughrue Mion, PLLC

(57) ABSTRACT

A semiconductor package includes a film substrate; a wiring layer provided on the film substrate; and a semiconductor chip provided on the wiring layer and electrically connected to the wiring layer. The film substrate includes a first layer, wherein the first layer is an insulating layer having the wiring layer thereon. The film substrate further includes a second layer, wherein the second layer is attached to a bottom of the first layer and comprises a gas. The second layer is configured to be peeled off of the first layer.

13 Claims, 15 Drawing Sheets

(51) Int. Cl.
*H10W 74/15* (2026.01)
*H10W 90/00* (2026.01)

(52) U.S. Cl.
CPC .......... *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 2022/0013370 | A1 | 1/2022 | Lee et al. | |
| 2022/0139799 | A1* | 5/2022 | Jung | H10W 40/10 361/749 |
| 2023/0105691 | A1* | 4/2023 | Tsuzuki | C09J 7/381 362/97.3 |

FOREIGN PATENT DOCUMENTS

| | | | |
|---|---|---|---|
| JP | WO2017/168820 | A1 | 10/2017 |
| JP | 2018-44148 | A | 3/2018 |
| JP | 2019-91845 | A | 6/2019 |
| KR | 10-2021-0138263 | A | 11/2021 |
| KR | 10-2022-0012676 | A | 2/2022 |

OTHER PUBLICATIONS

Communication dated Apr. 2, 2026, issued by the Korean Ministry of Intellectual Property in Korean Application No. 10-2022-0111088.

* cited by examiner

FILM SUBSTRATE, SEMICONDUCTOR PACKAGE INCLUDING THE FILM SUBSTRATE, AND METHOD USING THE SEMICONDUCTOR PACKAGE

CROSS-REFERENCE TO RELATED APPLICATION

This application claims priority to Korean Patent Application No. 10-2022-0111088, filed on Sep. 2, 2022, in the Korean Intellectual Property Office, the disclosure of which is incorporated by reference herein in its entirety.

BACKGROUND

1. Field

The present disclosure relates to a film substrate, a semiconductor package including the film substrate, and a method of fabricating a display device using the semiconductor package, and more particularly, to a film substrate applicable to a chip-on-film (COF), a semiconductor package including the film substrate, and a method of fabricating a display device using the semiconductor package.

2. Description of the Related Art

A chip-on-film (COF) package may facilitate the miniaturization and weight-reduction of an electronic product. The COF package may also facilitate the miniaturization of the bezel and the panel of a display device.

The COF package may be fabricated using a reel-to-reel method. However, when a thin base film such as a thin COF is used to fabricate the COF package, the COF package may be detached from the manufacturing equipment or may be broken during the fabrication of the COF package, due to the lack of stiffness of the base film.

SUMMARY

One or more example embodiments provide a film substrate including a carrier film that can be detached from a base film, a semiconductor package including the film substrate, and a method of fabricating a display device using the semiconductor package.

According to an aspect of an example embodiment, a semiconductor package includes: a film substrate; a wiring layer provided on the film substrate; and a semiconductor chip provided on the wiring layer and electrically connected to the wiring layer, wherein the film substrate comprises a first layer, wherein the first layer is an insulating layer having the wiring layer thereon, wherein the film substrate further comprises a second layer, wherein the second layer is attached to a bottom of the first layer and comprises a gas, and wherein the second layer is configured to be peeled off of the first layer.

According to an aspect of an example embodiment, a method of using a semiconductor package includes: manufacturing a semiconductor package comprising a base film and a carrier film configured to be peeled off of the base film; fabricating a display device by connecting the semiconductor package, a display panel, and a controller; applying light to the semiconductor package; and peeling the carrier film off of the base film.

According to an aspect of an example embodiment, a film substrate includes: a first layer comprising a first insulating layer, and a wiring layer and a semiconductor chip provided on the first layer; a second layer attached to a bottom of the first layer and comprising a gas inside the second layer; a third layer comprising an adhesive layer, attached to a bottom of the second layer; and a fourth layer comprising a second insulating layer, attached to a bottom of the third layer, wherein the second layer is configured to be peeled off of the first layer.

BRIEF DESCRIPTION OF DRAWINGS

The above and other aspects and features will become more apparent from the following description of example embodiments, taken in conjunction with the accompanying drawings, in which.

DETAILED DESCRIPTION

Figure 1:
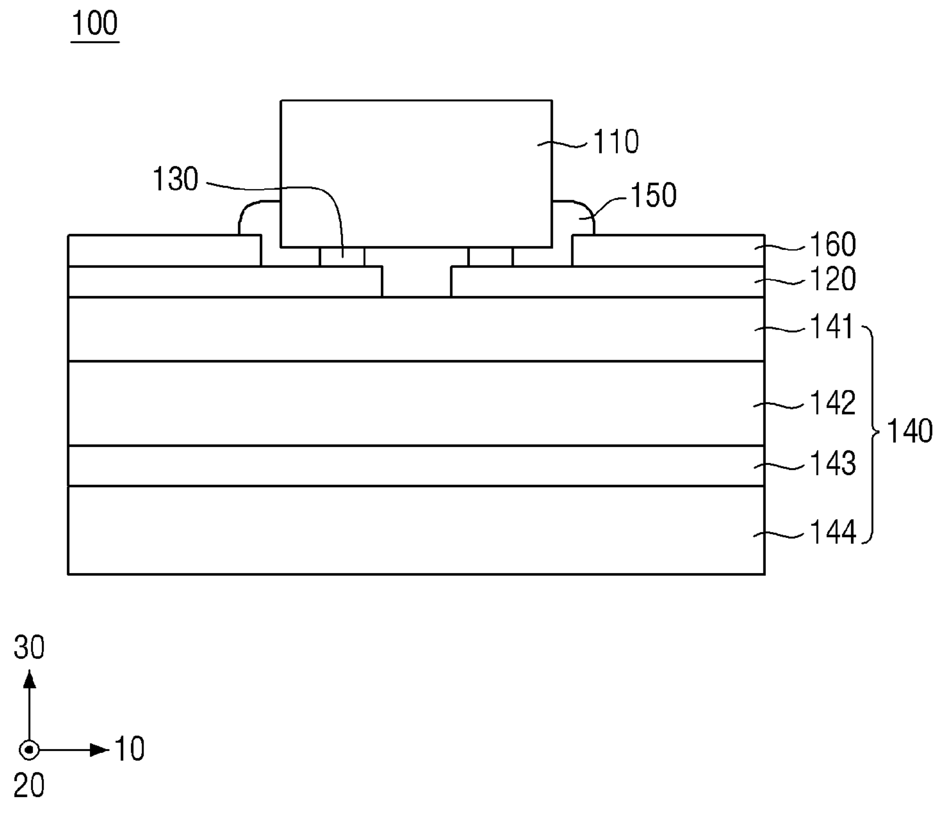
FIG. 1 is a cross-sectional view of a semiconductor package according to a first embodiment of the present disclosure.

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The same constituent elements on the drawings are denoted by the same reference numerals, and repeated descriptions thereof will be omitted.

To address defects that may be caused due to the lack of stiffness of a base film when performing packaging using a reel-to-reel method and using a thin base film, a film substrate including a carrier film that can be detached from the base film, a semiconductor package including the film substrate, and a method of fabricating a semiconductor package using the semiconductor package are provided. Embodiments of the present disclosure will hereinafter be described with reference to the accompanying drawings.

FIG. 1 is a cross-sectional view of a semiconductor package according to a first embodiment of the present disclosure.

Referring to FIG. 1, a semiconductor package 100 may include a semiconductor chip 110, a wiring layer 120, a bump structure 130, a film substrate 140, an underfill layer 150, and a passivation layer 160.

The semiconductor package 100, which is obtained by a packaging process and includes the semiconductor chip 110, may mount the semiconductor chip 110 on the film substrate 140 via flip-chip bonding and may electrically connect the semiconductor chip 110 and an external circuit via the wiring layer 120. In this case, input pins and output pins to be connected to the external circuit may be formed at or around both ends of the wiring layer 120.

The semiconductor package 100 may be applied to control a display device. The semiconductor package 100 may be provided as, for example, a display driver integrated circuit (DDI) package including a DDI. The semiconductor package 100 will hereinafter be described as being a DDI package, but the present disclosure is not limited thereto. Obviously, the semiconductor package 100 may also be applied to display a semiconductor device.

The semiconductor chip 110, which controls a display device, may be disposed in a circuit area (particularly, a chip mounting area) of the film substrate 140. As already mentioned above, the semiconductor chip 110 may be mounted on the film substrate 140 via flip-chip bonding.

The semiconductor chip 110 may be provided as a DDI capable of realizing a variety of colors by controlling a considerable number of pixels that form a display. In this case, the semiconductor package 100 may be disposed between a driver printed circuit board (PCB) and a display panel, and the semiconductor chip 110 may convert a digital signal output from the driver PCB into an analog signal and may transmit the analog signal to the display panel. The semiconductor chip 110 may be, for example, a logic chip or a memory chip. In an embodiment where the semiconductor chip 110 is a logic chip, the semiconductor chip 110 may be a central processing unit (CPU), a controller, or an application-specific integrated circuit (ASIC). In an embodiment where the semiconductor chip 110 is provided as a memory chip, the semiconductor chip 110 may be a volatile memory chip such as a dynamic random-access memory (DRAM) or a static random-access memory (SRAM) or a nonvolatile memory chip such as a phase-change random-access memory (PRAM), a magnetoresistive random-access memory (MRAM), a ferroelectric random-access memory (FeRAM), or a resistive random-access memory (RRAM).

In an embodiment where the semiconductor chip 110 is mounted on the film substrate 140, the semiconductor chip 110 may be connected to the wiring layer 120 via the bump structure 130. Although not specifically illustrated in FIG. 1, the bump structure 130 may be disposed close to bump pads exposed on an active surface of the semiconductor chip 110, and the semiconductor chip 110 may be electrically connected to the wiring layer 120 by physically and electrically connecting the bump structure 130 to the wiring layer 120 on the film substrate 140.

As both surfaces of the bump structure 130 are disposed to be in contact with the bump pads of the semiconductor chip 110 and the wiring layer 120, the bump structure 130 may electrically connect the semiconductor chip 110 and the wiring layer 120. The semiconductor chip 110 may receive at least one of a control signal, a power signal, and a ground signal from the outside and may also receive a data signal to be stored, from the outside. The semiconductor chip 110 may provide data stored therein to the outside.

The bump structure 130 may have a conductive pillar structure or a solder ball structure to electrically connect the semiconductor chip 110 and the wiring layer 120. The bump pads may function as the input terminals and output terminals of the semiconductor chip 110.

The wiring layer 120 may be formed on the film substrate 140 and electrically connect the semiconductor chip 110 and an external circuit. The wiring layer 120 may be formed on one surface of the film substrate 140 or on both surfaces of the film substrate 140. Although not specifically illustrated in FIG. 1, the wiring layer 120 may be formed on both surfaces of the film substrate 140, and wiring patterns on both surfaces of the film substrate 140 may be connected through vias penetrating the film substrate 140.

The wiring layer 120 may be formed of at least one conductive metal selected from among nickel (Ni), tin (Sb), chromium (Cr), copper (Cu), gold (Au), silver (Ag), platinum (Pt), and aluminum (Al). The wiring layer 120 may be formed by patterning a metal layer formed on the film substrate 140 via casting, lamination, or electroplating. However, the material of the wiring layer 120 and how to form the wiring layer 120 are not particularly limited.

Figure 2:
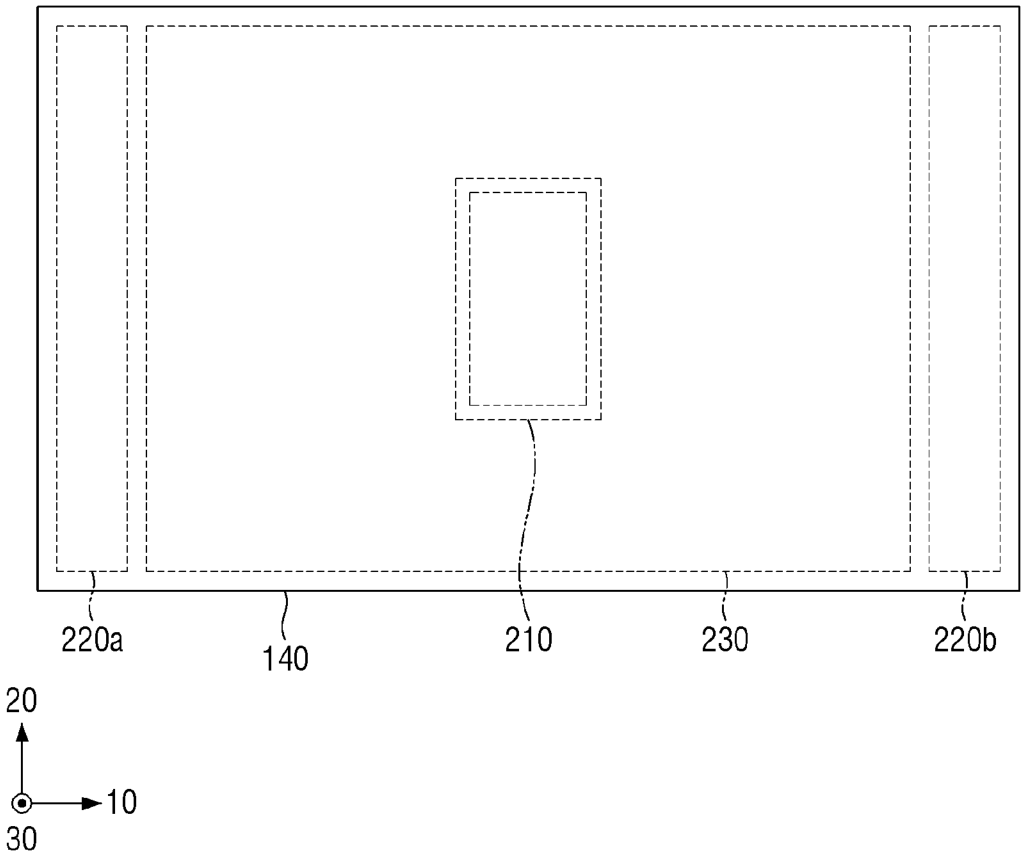
FIG. 2 illustrates an exemplary wiring layer of the semiconductor package of FIG. 1.

The wiring layer 120 may include inner leads, outer leads, and wiring patterns. The inner leads, which may be electroconductive lines, may be formed in an inner lead region 210. Referring to FIG. 2, the inner lead region 210 may be positioned in a center zone on the film substrate 140 and may be formed to overlap at least partially with an area where the semiconductor chip 210 is mounted. The bump structure 130 may be disposed on the inner leads, and the inner leads may allow the wiring layer 120 and the semiconductor chip 110 to be electrically connected via the bump structure 130.

The outer leads, which may be electroconductive lines, may be formed in first and second outer lead regions 220*a* and 220*b*. The first and second outer lead regions 220*a* and 220*b* may be disposed in edge zones on the film substrate 140. The first and second outer lead regions 220*a* and 220*b* may be disposed at both ends of the film substrate 140, outer leads formed in the first outer lead region 220*a* may function as input pins, and outer leads formed in the second outer lead region 220*b* may function as output pins. However, embodiment are not limited thereto. Alternatively, one or more outer lead regions may be formed at one end of the film substrate 140 or at four ends of the film substrate 140.

The wiring patterns, which are electroconductive lines, may connect the inner leads and the outer leads and may be formed in a wiring region 230. The wiring region 230 may be provided on the entire film substrate 140 except for the inner lead region 210 and the first and second outer lead regions 220*a* and 220*b*. FIG. 2 illustrates an exemplary wiring layer of the semiconductor package 100.

Referring again to FIG. 1, the film substrate 140 may have an insulating property and may include a base film. The semiconductor chip 110, the wiring layer 120, and the bump structure 130 may be disposed on the film substrate 140. The film substrate 140 may be formed to have a predetermined width. The film substrate 140 may be formed to have flexibility or rigid flexibility in consideration of bending. Alternatively, the film substrate 140 may be formed to have rigidity without consideration of bending.

The film substrate 140 may include four layers. That is, the film substrate 140 may include first, second, third, and fourth layers 141, 142, 143, and 144.

The first layer 141 may be formed as the uppermost layer of the film substrate 140, which means that the wiring layer 120 is formed on the first layer 141. The first layer 141 may be provided as a base film having a predetermined thickness.

The first layer 141 may include an insulating material. For example, the first layer 141 may include a polyimide (PI) resin having an excellent thermal expansion coefficient and durability. The first layer 141 may include an insulating synthetic resin such as polyimide (PI), polyethylene terephthalate (PET), polyethylene naphthalate (PEN), polyether nitrile (PEN), polyether sulfone (PESU), an epoxy resin, or an acrylic resin.

The second layer 142 may be formed as a layer below the first layer 141 of the film substrate 140. The second layer 142 may be an adhesive layer and may be attached onto the bottom surface of the first layer 141.

In an embodiment where the second layer 142 is an adhesive layer, the second layer 142 may include at least one of an inorganic adhesive and a polymer adhesive. The polymer adhesive may be classified into a thermosetting resin or a thermoplastic resin. After the heat-molding of the monomer, the thermosetting resin has a three-dimensional (3D) network structure and may not be softened even when heated again. Instead, the thermoplastic resin, which exhibits plasticity when heated, may have a linear polymer structure. The second layer 142 may have the shape of an adhesive tape, but the present disclosure is not limited thereto.

Figure 3:
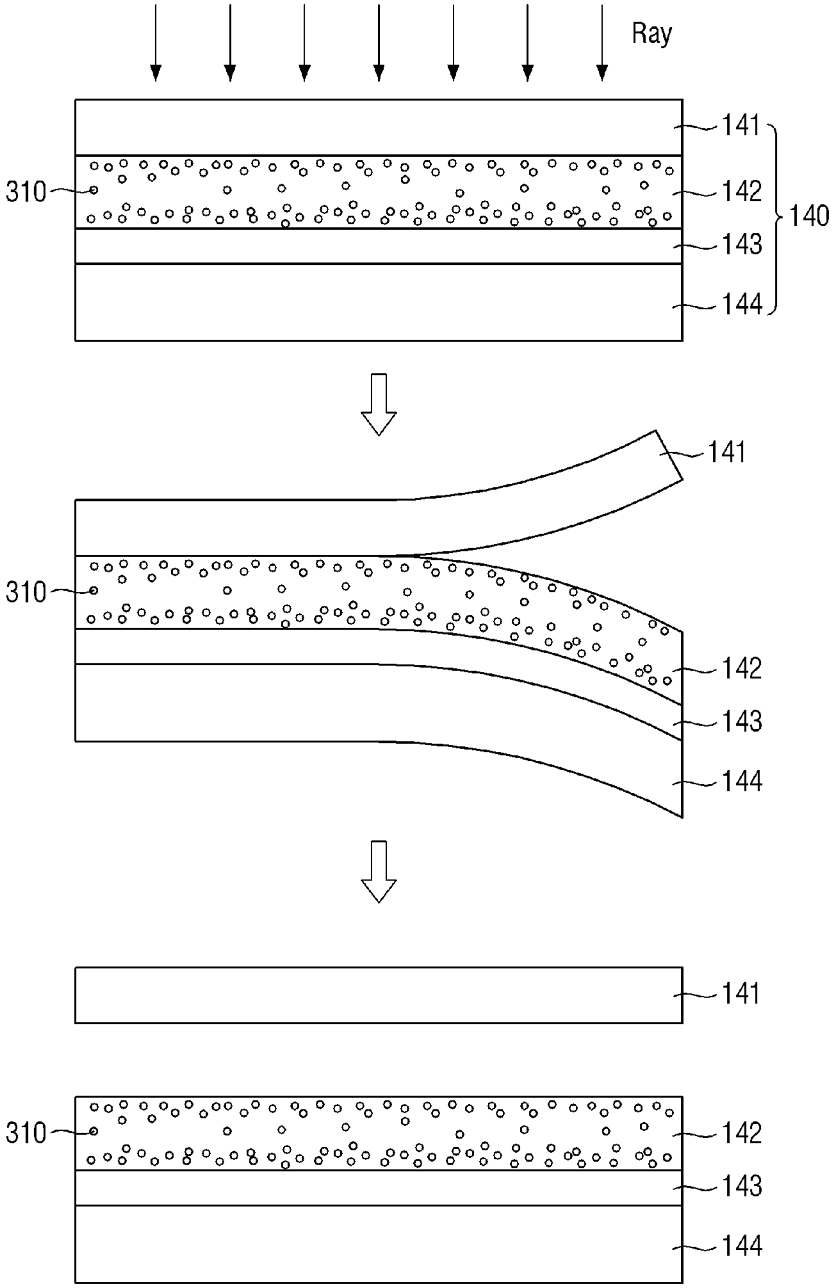
FIG. 3 illustrates an exemplary film substrate of the semiconductor package of FIG. 1.

The second layer 142 may be formed to include a considerable amount of gas therein. Referring to FIG. 3, when the second layer 142 is exposed to light "Ray", a gas 310 included in the second layer 142 may foam. Then, the second layer 142 may be peeled off of the first layer 141 by the foamed gas. The light "Ray" may be ultraviolet (UV) light output by a UV lamp. FIG. 3 illustrates an exemplary film substrate of the semiconductor package 100.

In order for a base film (e.g., a thin COF) having a thickness of 30 μm or less to be applicable to the fabrication of a chip-on-film (COF) package, problems associated with the lack of stiffness of the base film such as, for example, the escape of the base film from the manufacturing equipment and the tearing of the base film, need to be addressed.

In order to solve these problems, the base film may be supported by reinforcing the rails of the manufacturing equipment, in which a reel-to-reel process is performed, with jigs, or reducing the distance between sprockets or rollers. However, there is still a limit in reducing the thickness of the base film.

As the film substrate 140 includes a base film and a carrier film that can be detached from the base film, the problems associated with a thin base film can be addressed, and the thickness of the base film can be reduced to 30 μm or less.

As described above, the film substrate 140 may include the first, second, third, and fourth layers 141, 142, 143, and 144. Here, the first layer 141 may form a base film, and the second, third, and fourth layers 142, 143, and 144 may form a carrier film. Alternatively, the first layer 141 may form a base film, and the fourth layer 144 may form a carrier film. The second layer 142 will hereinafter be described.

The second layer 142 may be formed of a material having adhesiveness. Also, the second layer 142 may include the gas 310, which foams upon exposure to light. Here, the gas 310 may be a component of the second layer 142. The gas 310 may account for a larger volume in the second layer 142 than the other components (e.g., the material having adhesiveness) to allow the second layer 142 to be easily detached from the first layer 141 in response to the foaming of the gas 310. For example, the gas 310 may account for at least 50% of the entire volume of the second layer 142 or more than 50% of the entire volume of the second layer 142.

However, the present disclosure is not limited to this. If the degree to which the gas 310 foams increases proportionally to the duration of exposure to light, the gas 310 may account for a smaller volume in the second layer 142 than the other components. For example, the gas 310 may account for less than 50% of the entire volume of the second layer 142.

Figure 4:
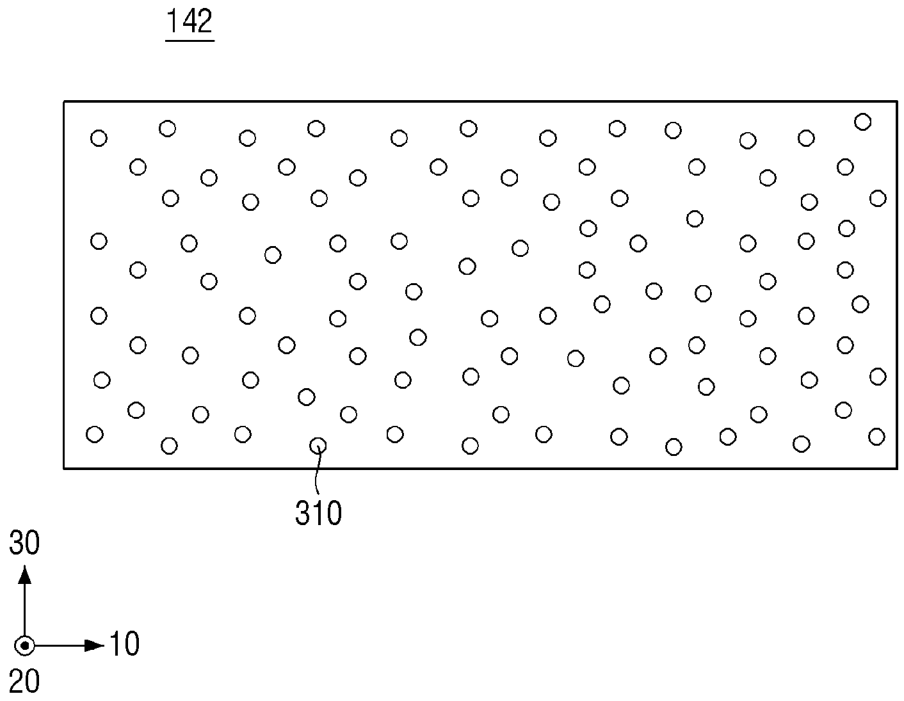
FIG. 4 illustrates a first exemplary view for explaining the second layer in the film substrate of the semiconductor package of FIG. 1.

The gas 310 may be injected and included in the second layer 142 during the formation of the second layer 142. The second layer 142 may be formed by injection molding. Referring to FIG. 4, the gas 310 may be evenly distributed in the entire second layer 142, but the embodiments are not limited thereto. FIG. 4 illustrates a first exemplary view for explaining the second layer in the film substrate of the semiconductor package 100.

In other embodiments, the gas 310 may be distributed densely in some part of the second layer 142. Specifically, the gas 310 may be distributed in the entire second layer 142, but more densely in one part than another part of the second layer 142, or may be distributed only in some part of the second layer 142.

Figure 5:
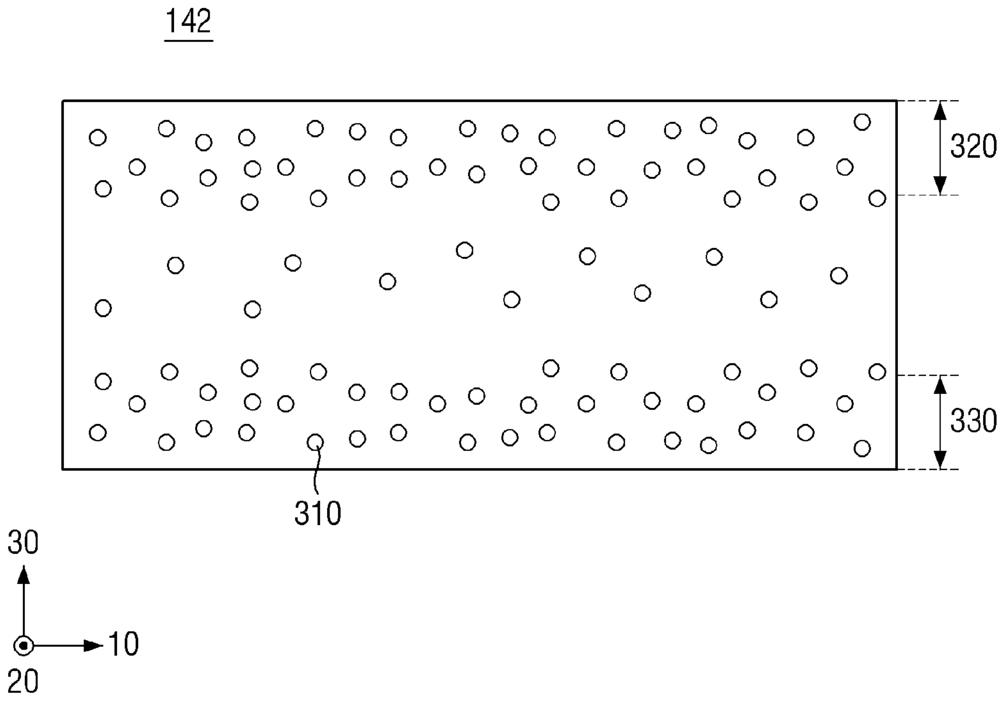
FIG. 5 illustrates a second exemplary view for explaining the second layer in the film substrate of the semiconductor package of FIG. 1.

For example, referring to FIG. 5, the gas 310 may be densely distributed in upper and lower end parts of the second layer 142. Here, the upper end part of the second layer 142 may be part of the second layer 142 that is close to the first layer 141, and the lower end part of the second layer 142 may be part of the second layer 142 that is close to the third layer 143. FIG. 5 illustrates a second exemplary view for explaining the second layer in the film substrate of the semiconductor package 100.

Figure 6:
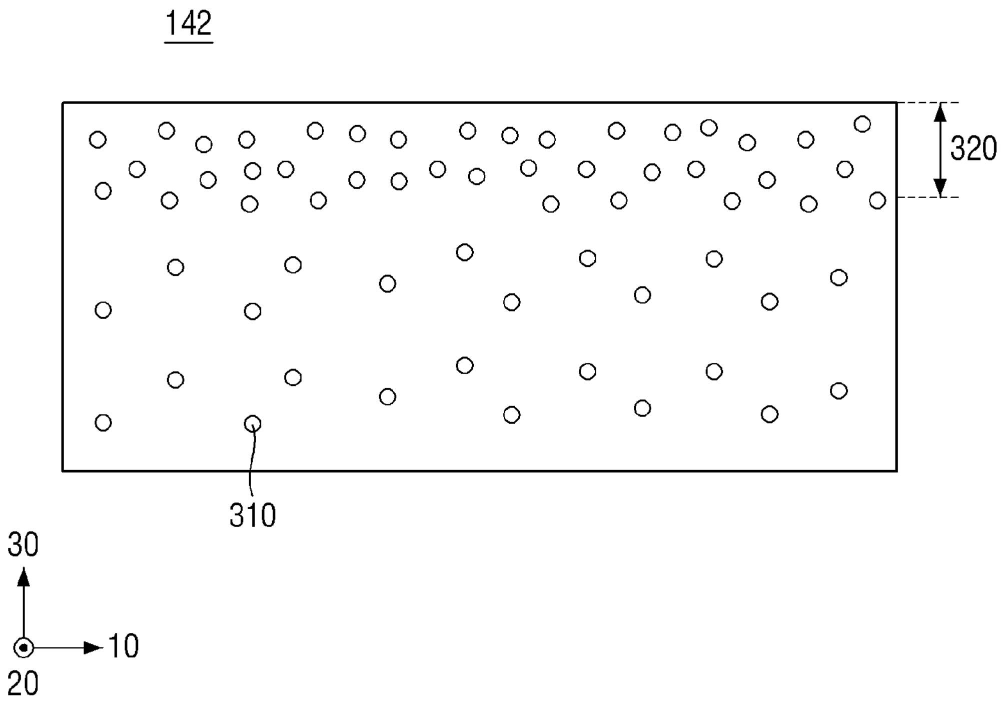
FIG. 6 illustrates a third exemplary view for explaining the second layer in the film substrate of the semiconductor package of FIG. 1.

In another example embodiment, referring to FIG. 6, the gas 310 may be densely distributed only in the upper end part of the second layer 142. In another example embodiment, the gas 310 may be densely distributed only in the lower end part of the second layer 142. FIG. 6 illustrates a third exemplary view for explaining the second layer in the film substrate of the semiconductor package 100.

Figure 7:
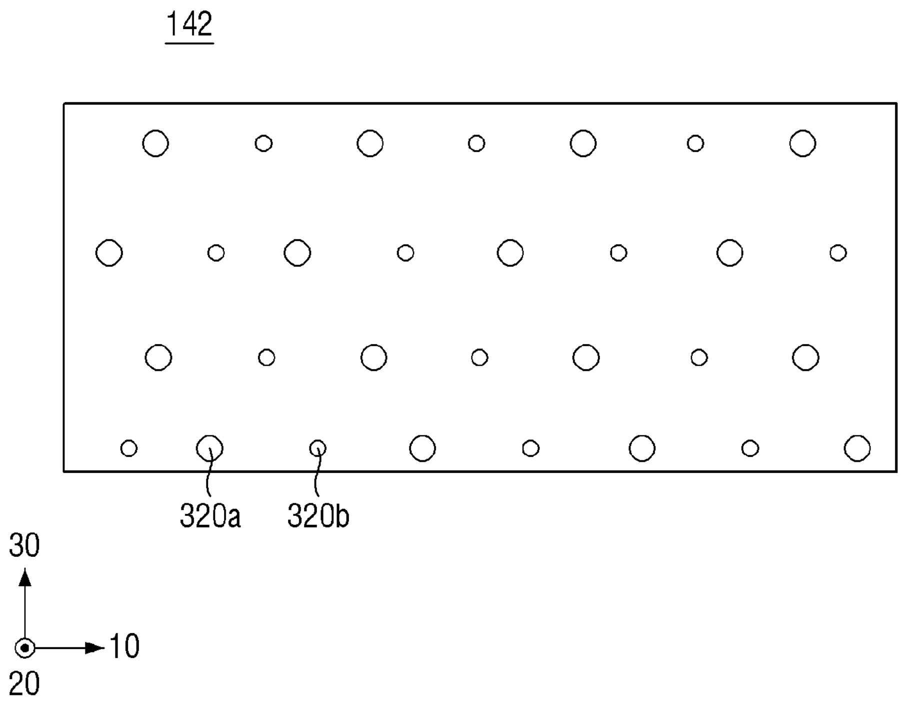
FIG. 7 illustrates a fourth exemplary view for explaining the second layer in the film substrate of the semiconductor package of FIG. 1.

The gas 310 may form a plurality of spaces or gaps in the second layer 142 when injected into the second layer 142. The gas 310 may form a plurality of gaps having the same size or different sizes in the second layer 142 and may be injected into the gaps. For example, referring to FIG. 7, the gas 310 may form two different types of gaps, i.e., first gaps 320*a* and second gaps 320*b*, in the second layer 142 and may be injected into the first gaps 320*a* and the second gaps 320*b*. The first gaps 320*a* may have a larger size than the second gaps 320*b*. FIG. 7 illustrates a fourth exemplary view for explaining the second layer in the film substrate of the semiconductor package 100.

The first gaps 320*a* and the second gaps 320*b* are illustrated in FIG. 7 as having a circular shape, but embodiments are not limited thereto. Alternatively, the first gaps 320*a* and the second gaps 320*b* may have various other shapes such as a polygonal shape (e.g., a triangular, rectangular, parallelogram, or rhombus shape) or an elliptical shape.

The gas 310 may be a fluid in a supercritical state and may be an inert gas. The gas 310 may be, for example, nitrogen gas ($N_2$) or carbon dioxide gas ($CO_2$).

Figure 8:
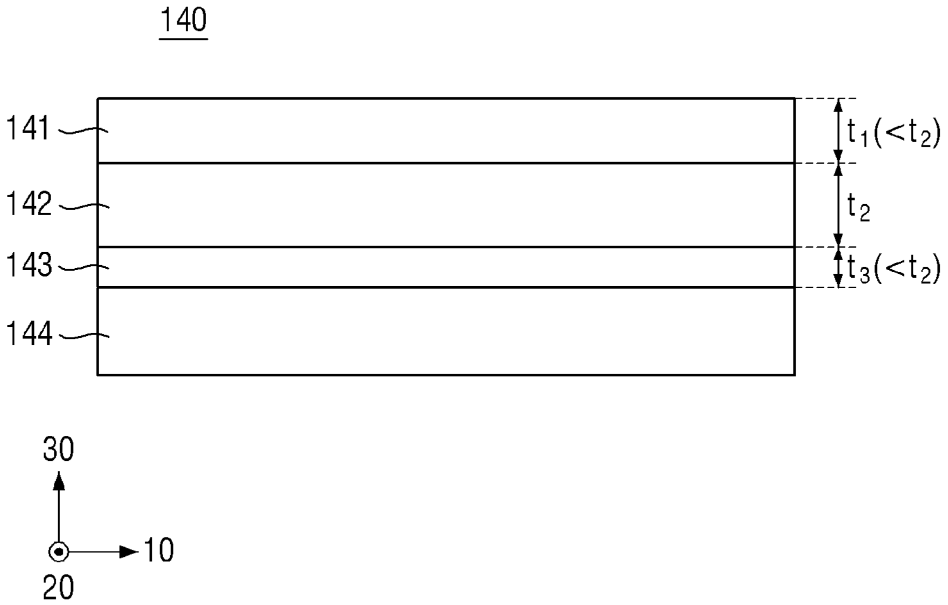
FIG. 8 illustrates a fifth exemplary view for explaining the second layer in the film substrate of the semiconductor package of FIG. 1.

The second layer 142 may be formed to include the gas 310. Referring to a thickness $t_2$ of the second layer 142 may be greater than a thickness $t_1$ of the first layer 141 (i.e., $t_2>t_1$) and may also be greater than a thickness $t_3$ of the third layer 143 (i.e., $t_2>t_3$), but embodiments are not limited thereto. Alternatively, the second layer 142 may be formed to have the same thickness as the first layer 141, i.e., $t_2=t_1$. FIG. 8 illustrates a fifth exemplary view for explaining the second layer in the film substrate of the semiconductor package 100.

Referring again to FIG. 1, the third layer 143 may be formed in the film substrate 140 as a layer below the second layer 142. The third layer 143, which is an adhesive layer, like the second layer 142, may include at least one of an inorganic adhesive and a polymer adhesive.

The third layer 143 may function as an adhesive in the film substrate 140 and may bond the second and fourth layers 142 and 144. The third layer 143 may also bond the first and fourth layers 141 and 144, together with the second layer 142.

The third layer 143, unlike the second layer 142, may not include the gas 310, but embodiments are not limited thereto. Alternatively, the third layer 143, like the second layer 142, may include the gas 310. That is, the third layer 143 may or may not include gas 310.

As discussed above, the third layer 143 may be formed to be thinner than the second layer 142 (i.e., $t_3<t_2$), but embodiments are not limited thereto. In an embodiment where the third layer 143, like the second layer 142, includes the gas 310, the third layer 143 may be formed to have the same thickness as the second layer 142 (i.e., $t_3=t_2$). Alternatively, the third layer 143 may be thicker than the second layer 142 (i.e., $t_3>t_2$). In other embodiments the third layer 143 may be formed to include the gas 310, and yet be thinner than the second layer 142 (i.e., $t_3<t_2$).

In an embodiment where the second and third layers 142 and 143 both include the gas 310, the amount of the gas 310 included in the second layer 142, which is closer than the third layer 143 to the first layer 141, may be greater than the amount of the gas 310 included in the third layer 143, but embodiments are not limited thereto. Alternatively, the amount of the gas 310 included in the second layer 142 may be the same as, or less than, the amount of the gas 310 included in the third layer 143.

Figure 9:
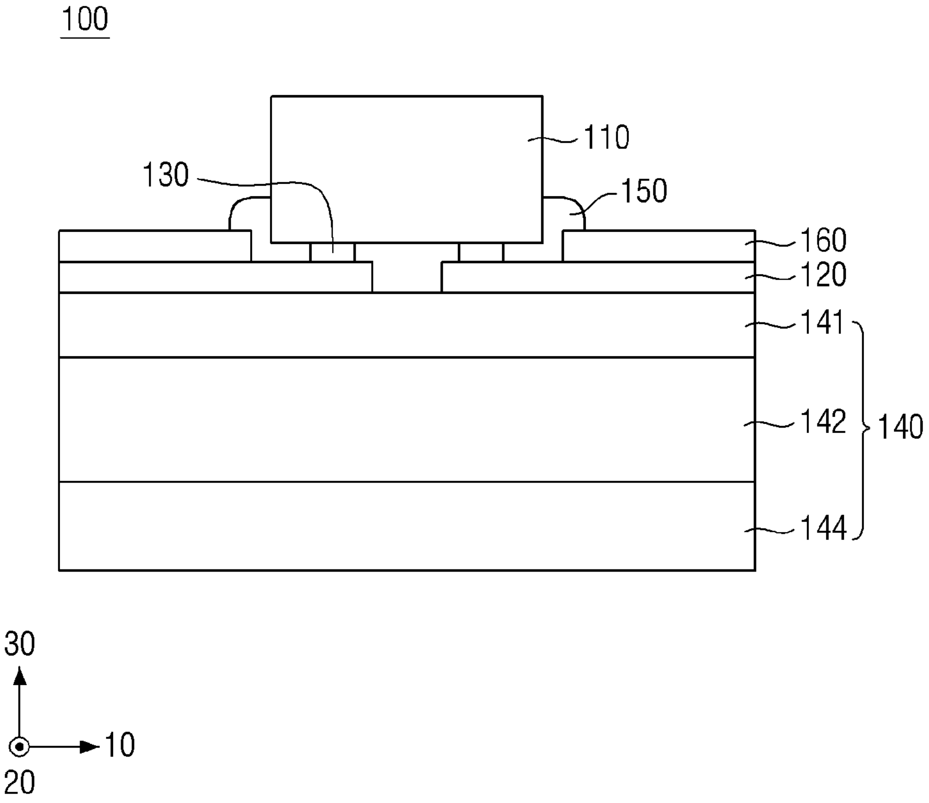
FIG. 9 is a cross-sectional view of a semiconductor package according to a second embodiment of the present disclosure.

Not only the second layer 142, but also the third layer 143 may bond the base film and the carrier film of the film substrate 140, i.e., the first and fourth layers 141 and 144. If the second layer 142, which includes the gas 310, is sufficient to properly bond the first and fourth layers 141 and 144, the film substrate 140 may include only the first, second, and fourth layers 141, 142, and 144, as illustrated in FIG. 9. For example, if the second layer 142 has the structure illustrated in FIG. 6, the film substrate 140 may include only the first, second, and fourth layers 141, 142, and 144. FIG. 9 is a cross-sectional view of a semiconductor package according to a second embodiment of the present disclosure.

Referring again to FIG. 1, the fourth layer 144 may be formed as the lowermost layer of the film substrate 140. Specifically, the third layer 143 may be formed on the fourth layer 144, the second layer 142 may be formed on the third layer 143, and the first layer 141 may be formed on the second layer 142.

The fourth layer 144 may be provided as a carrier film having a predetermined thickness. As already mentioned above, the carrier film of the film substrate 140 may refer to the fourth layer 144 or may refer to the entire film substrate 14 except for the first layer 141, i.e., the second, third, and fourth layers 142, 143, and 144.

The fourth layer 144, like the first layer 141, may be formed of an insulating material. For example, the fourth layer 144 may be formed of a polyimide (PI) resin having an excellent thermal expansion coefficient and durability. The fourth layer 144 may include an insulating synthetic resin such as polyimide (PI), polyethylene terephthalate (PET), polyethylene naphthalate (PEN), polyether nitrile (PEN), polyether sulfone (PESU), an epoxy resin, or an acrylic resin.

Figure 10:
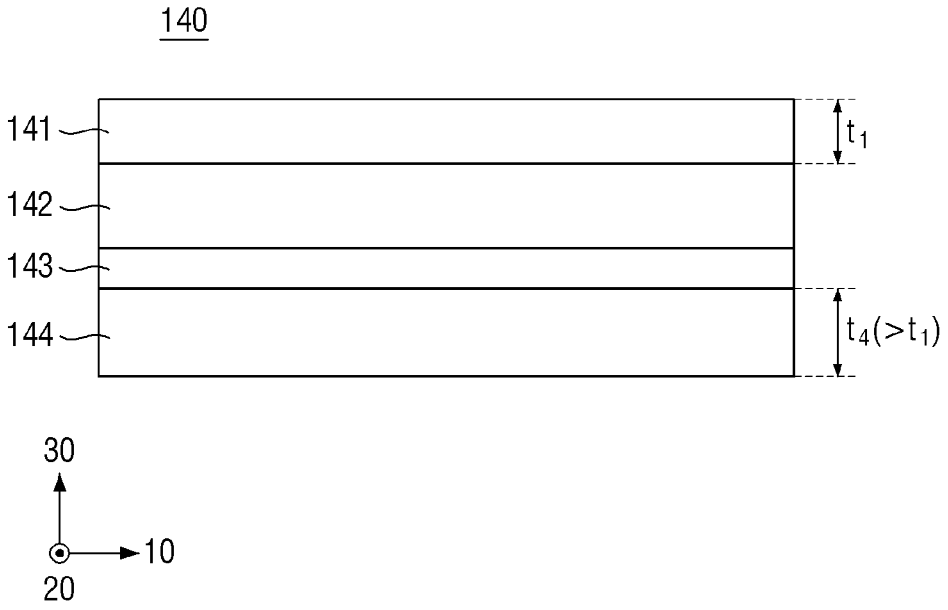
FIG. 10 illustrates an exemplary fourth layer of the film substrate of the semiconductor package of FIG. 1.

As discussed above, the first layer 141 may be a thin base film (e.g., a thin COF). On the contrary, the fourth layer 144 may be provided as a thick carrier film (e.g., a thick polyimide (PI) film). In other words, referring to FIG. 10, a thickness $t_4$ of the fourth layer 144 may be greater than a thickness $t_1$ of the first layer 141 (i.e., $t_4>t_1$), but the present disclosure is not limited thereto. FIG. 10 illustrates an exemplary fourth layer of the film substrate of the semiconductor package 100.

Alternatively, the fourth layer 144 may be formed to have the same thickness as the first layer 141. Alternatively, if the second layer 142 is sufficiently thick (for example, if the second layer 142 has the same thickness as, or is thicker than, the first layer 141), the fourth layer 141 may be formed to be thinner than the first layer 141.

Figure 11:
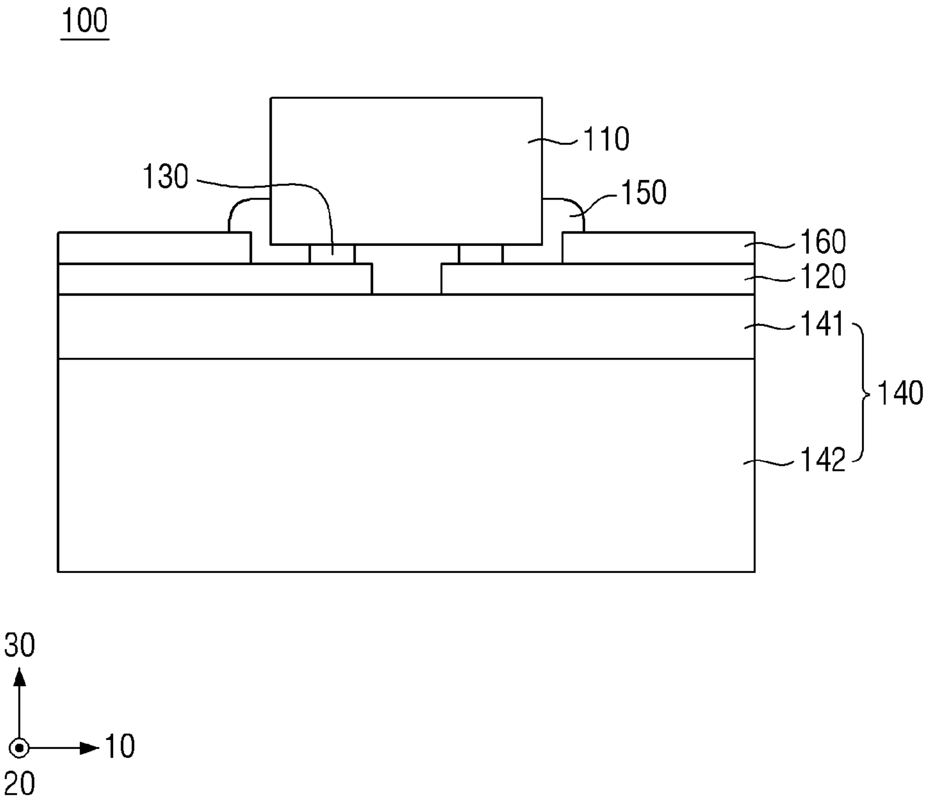
FIG. 11 is a cross-sectional view of a semiconductor package according to a third embodiment of the present disclosure.

If the second layer 142 performs the functions of the fourth layer 144, the film substrate 140 may be configured to include only the first and second layers 141 and 142, as illustrated in FIG. 11. FIG. 11 is a cross-sectional view of a semiconductor package according to a third embodiment of the present disclosure.

Figure 12:
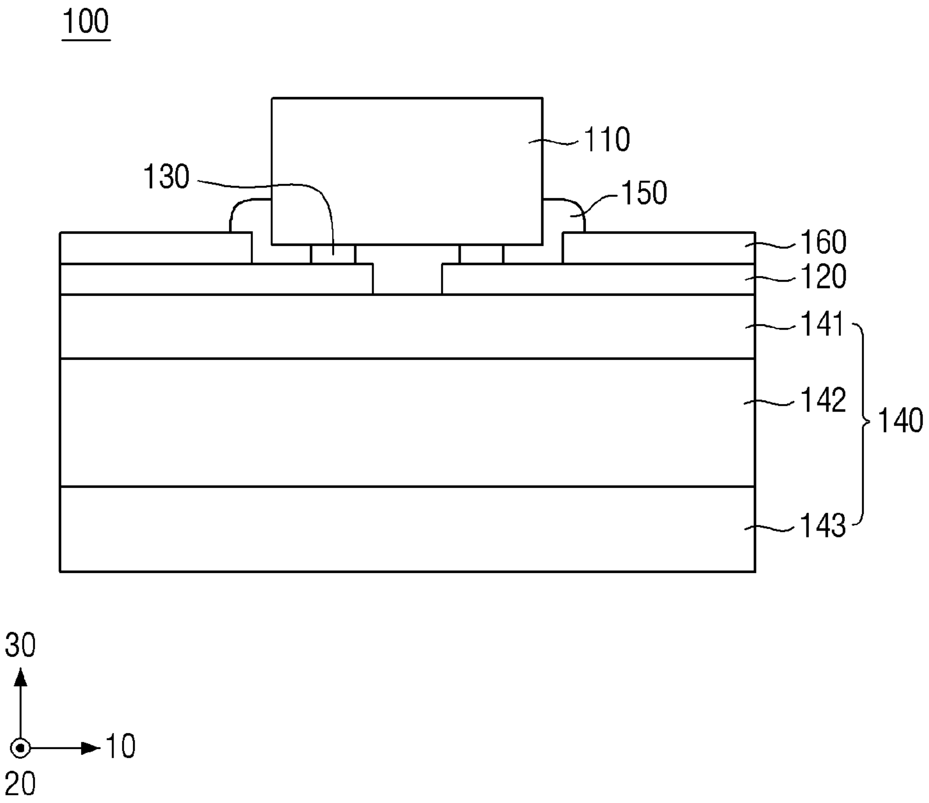
FIG. 12 is a cross-sectional view of a semiconductor package according to a fourth embodiment of the present disclosure.

Alternatively, the film substrate 140 may include only the first, second, and third layers 141, 142, and 143, as illustrated in FIG. 12. FIG. 12 is a cross-sectional view of a semiconductor package according to a fourth embodiment.

In an embodiment where the second layer 142 performs the functions of the fourth layer 144, the second layer 142 may include an insulating material. In an embodiment where the film substrate 140 does not include the fourth layer 144, the third layer 143 may include an insulating material, or the second and third layers 142 and 143 may both include an insulating material.

Referring again to FIG. 1, the passivation layer 160 may be formed on the wiring layer 120 and may protect the wiring layer 120. The passivation layer 160 may be formed of an insulating material such as, for example, solder resist.

The passivation layer 160 may be formed by various methods such as printing, bonding, coating, or photolithography to cover the wiring layer 120. For example, the passivation layer 160 may be formed by printing or coating liquid solder resist. In another example, the passivation layer 160 may be formed by laminating a protective film (e.g., a coverlay film) on the wiring layer 120, but the present disclosure is not limited thereto. Various materials and methods may be used to form the passivation layer 160 as long as they can properly form an insulating layer capable of protecting the wiring layer 120.

The passivation layer 160 may be formed to cover part of the wiring layer 120. In an embodiment where the wiring layer 120 includes the inner leads, the outer leads, and the wiring patterns, the passivation layer 160 may be formed to cover the wiring patterns. The passivation layer 160 may be formed to cover the top surface of the wiring layer 120. Alternatively, the passivation layer 160 may be formed to cover not only the top surface, but also the side surfaces of the wiring layer 120.

The underfill layer 150 may be formed to protect the bump structure 130 and the surroundings of the bump structure 130 not to be physically and/or chemically damaged. The underfill layer 150 may be formed to surround the bump structure 130, between the semiconductor chip 110 and the wiring layer 120.

The underfill layer 150 may be formed by a capillary underfill process, but the present disclosure is not limited thereto. That is, the underfill layer 150 may be formed by various other processes. The underfill layer 150 may be formed of, for example, an epoxy resin, but the material of the underfill layer 150 is not particularly limited. That is, various suitable materials may be used to form the underfill layer 150.

The film substrate 140, which includes a base film, i.e., the first layer 141, and a carrier layer detachable from the base film, i.e., the second, third, and fourth layers 142, 143, and 144, and the semiconductor package 100, which includes the film substrate 140, have been described so far with reference to FIGS. 1 through 12.

Embodiments relate to the structure of a COF including a thin base film and a carrier film that can be peeled off of the base film by foaming a $N_2$ gas through the irradiation of UV light and how to produce the COF. The COF aims at securing a sufficient thickness to drive the manufacturing equipment and strengthening stiffness by attaching the carrier film to the bottom of the base film. Accordingly, the COF can be prevented from escaping the manufacturing equipment and being torn, and the yield of assembly can be improved because sufficient stiffness can be secured.

Figure 13:
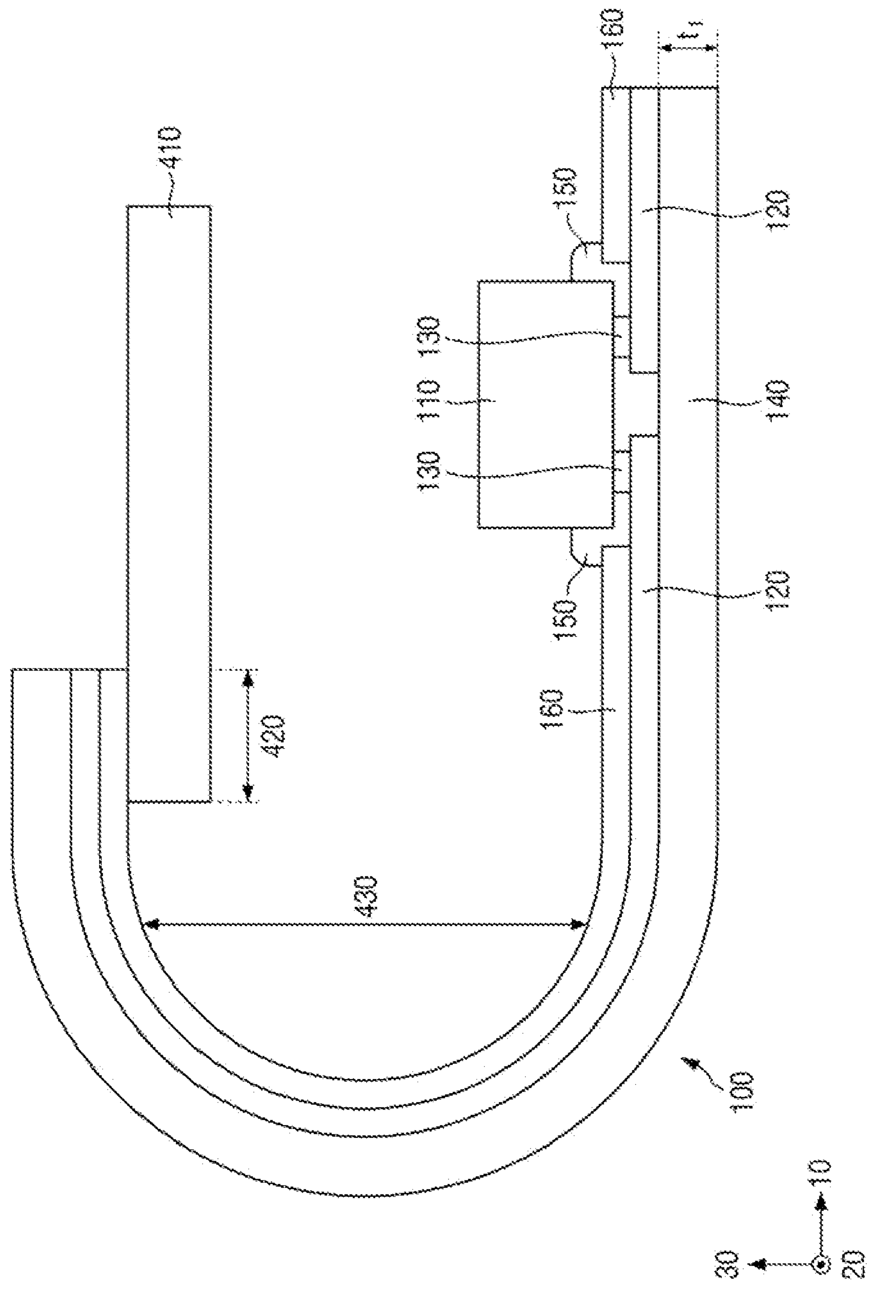
FIG. 13 is a cross-sectional view of a display device including a semiconductor package.

As discussed above, the semiconductor package 100 may be provided as a COF that can be applied to a display device. FIG. 13 is a cross-sectional view of a display device including a semiconductor package.

Referring to FIG. 13, a display device 400 may include the semiconductor package 100, a driver printed circuit board (PCB) (not illustrated), and a display panel 410.

The semiconductor package 100 may be a package including the semiconductor chip 110, and the semiconductor chip 110 may be a DDI. In some embodiments, one semiconductor chip 110 may be disposed in one semiconductor package 100. In some embodiments, different types of semiconductor chips 110 may be disposed in one semiconductor package 100. For example, the semiconductor chip(s) 110 may include a source driver chip and/or a gate driver chip.

The semiconductor package 100 may include the film substrate 140 and the semiconductor chip 110, the wiring layer 120, the underfill layer 150, and the passivation layer 160, which are formed on the film substrate 140. The film substrate 140 may include the first layer 141, which corresponds to a base film, and the second, third, and fourth layers 142, 143, and 144, which correspond to a carrier film. The film substrate 140 may have a bending area with a predetermined curvature radius and may be formed of a flexible insulating material.

Although not specifically illustrated in FIG. 13, the semiconductor package 100 may be positioned between, and connected to, the driver PCB and the display panel 410. Specifically, the semiconductor package 100 may receive signals from the driver PCB and may transmit the received signals to the display panel 410.

One or more driver circuit chips, which can simultaneously or sequentially apply power and signals to the semiconductor package 100, may be mounted on the driver PCB, which is a controller for controlling the display panel 410. The semiconductor package 100 may be electrically connected to driving connection wiring of the driver PCB.

The display panel 410 may be, for example, a liquid crystal display (LCD) panel, a light-emitting diode (LED) display panel, an organic LED (OLED) display panel, or a plasma display panel (PDP).

The semiconductor package 100 may be connected only to one side (e.g., the bottom side) of the display panel 410, but the present disclosure is not limited thereto. Alternatively, in some embodiments, one or more semiconductor packages 100 may be connected to two or more sides of the display panel 410.

The display panel 410 may include a transparent substrate and an image region and panel connection wiring, which are formed on the transparent substrate. The transparent substrate may have front and rear surfaces that are opposite to each other, and the image region may be disposed on the front side of the transparent substrate. The transparent substrate may be, for example, a glass substrate or a flexible substrate. A plurality of pixels included in the image region may be connected to a plurality of panel connection lines and may thus operate in accordance with signals from the semiconductor chip 110 on the semiconductor package 100. The semiconductor package 100 may be bent and fixed on the front surface of the transparent substrate, and the driver PCB may be disposed to face the rear surface of the transparent substrate.

Input pads may be formed at one end of the semiconductor package 100, and output pads may be formed at the other end of the semiconductor package 100. The input pads and the output pads may be connected to the driving connection wiring of the driver PCB and the panel connection wiring of the display panel 410 via anisotropic conductive layers. The anisotropic conductive layers may be, for example, anisotropic conductive films (ACFs) or anisotropic conductive pastes. The anisotropic conductive layers may have a structure in which conductive particles are dispersed in an insulating adhesive layer. The anisotropic conductive layers may have anisotropic electrical characteristics. Thus, the anisotropic conductive layers may conduct electricity only in a direction between opposing electrodes and may be insulated in a direction between neighboring electrodes. When an adhesive is melted by applying heat and pressure to the anisotropic conductive layers, the conductive particles in the anisotropic conductive layers may be arranged and conducted between the opposing electrodes, for example, between the input pads and the drive connection wiring and between the output pads and the panel connection wiring, but the gaps between the neighboring electrodes may be filled with the adhesive and may thus be insulated.

During the fabrication of the display device 400, the semiconductor package 100 may be bent. In this case, the display panel 410 may be connected to one side of the semiconductor package 100, and the driver PCB may be connected to the other side of the semiconductor package 100. Specifically, the display panel 410 may be disposed at the front of the display device 400, the driver PCB may be disposed at the rear of the display device 400, and the semiconductor package 100 may be connected to the display panel 410 and the driver PCB, in a state of being bent. That is, the semiconductor package 100 may be bent when connected to the display panel 410 and driver PCB.

According to embodiments, in order to meet the recent demand for thin display panels, the size of a bezel 420, which protects the semiconductor package 100 and the driver PCB, may be reduced, and the area of contact between the semiconductor package 100 and the display panel 410 may also be reduced from, for example, 1 mm to, for example, 0.5 mm or less. In some instances, there is a risk that the adhesiveness of ACFs may be lowered due to a spring-back (SB) force during the bending of the display panel 410. To address these problems, the thickness of the base film of the semiconductor package 100, which has the bending area, may be reduced.

When the thickness of the base film is reduced to implement a thin base film (or a thin COF), the rails for a reel-to-reel process may be reinforced with jigs, and the distance between sprockets or between rollers may be reduced to support the base film. This, however, may cause defects such as wrinkling or sagging of the base film. Also, there is a limit in reducing the thickness of the base film.

Therefore, embodiments of the present disclosure may facilitate securing a sufficient thickness for driving the manufacturing equipment and strengthening stiffness by attaching a carrier film to the bottom of a base film. Embodiments of the present disclosure may also help prevent the base film from being deformed during, for example, a reel-to-reel assembly process. In embodiments, the carrier film may be peeled off of the base film by foaming a $N_2$ gas through the irradiation of UV light.

An embodiment of a semiconductor package 100 including a thin base film may be produced without making any changes to a reel-to-reel process or the manufacturing equipment for fabricating the display device 400.

According to an embodiment, the limit of reducing the thickness of a base film may be addressed.

According to an embodiment, a thickness of a base film may be reduced to any desired level by increasing the thickness of a carrier film by as much as the reduction in the thickness of the base film, whereas conventionally, the thickness of the base film can be reduced only to the support limit of the manufacturing equipment or processes.

Specifically, a conventional semiconductor package includes a base film, but no carrier film. Thus, the thickness of a polyimide (PI) film for a COF cannot be reduced to 30 μm or less. However, according to embodiments of the present disclosure, as the semiconductor package 100 includes not only a base film, i.e., the first layer 141, but also a carrier film, i.e., the second, third, and fourth layers 142, 143, and 144, which are an UV reactive adhesive layer, an adhesive layer, and an insulating layer, respectively, the thickness of a polyimide film (PI) for a COF, i.e., the first layer 141, can be reduced to 30 μm or less.

In an embodiment, the first layer 141 may have a thickness of 10 μm to 25 μm. Here, the thickness of 10 μm refers to the minimum thickness of the first layer 141 suitable for mounting the semiconductor chip 110 thereon.

Figure 14:
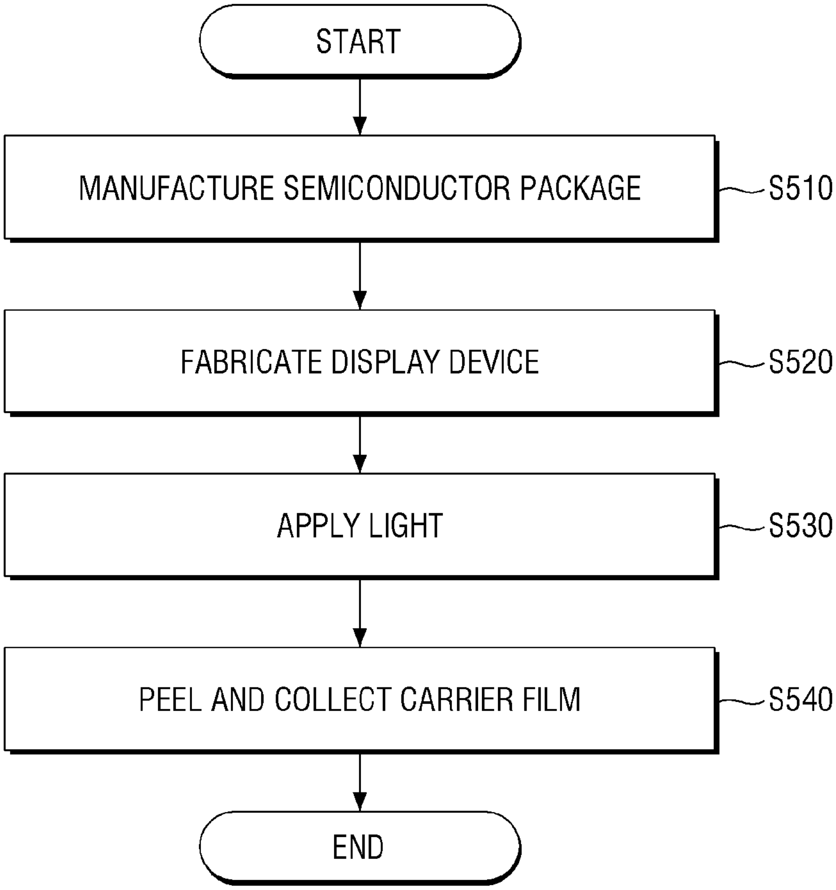
FIG. 14 is a flowchart illustrating a method of fabricating a display device including a semiconductor package.

A method of fabricating the display device 400 including the semiconductor package 100 will hereinafter be described with reference to FIG. 14. FIG. 14 is a flowchart illustrating a method of fabricating a display device including a semiconductor package.

Referring to FIG. 14, the semiconductor package 100 is fabricated (S510). The semiconductor package 100 may have the structure illustrated in FIG. 1 and may be fabricated as follows.

The first layer 141 is provided, and the wiring layer 120 is formed on the first layer 141.

The bump structure 130 is installed on the inner leads of the wiring layer 120, and the semiconductor chip 110 is mounted on the inner leads with the use of the bump structure 130.

The passivation layer 160 is formed on the wiring patterns of the wiring layer 120. The formation of the passivation layer 160, the installation of the bump structure 130, and the mounting of the semiconductor chip 110 may be performed at the same time, or the formation of the passivation layer 160 may be performed before the installation of the bump structure 130 or the mounting of the semiconductor chip 110.

The underfill layer 150, which surrounds the semiconductor chip 110, is formed to protect the bump structure 130.

The second, third, and fourth layers 142, 143, and 144 are attached to the bottom of the first layer 141. The second, third, and fourth layers 142, 143, and 144 may be bonded together first and may then be attached to the bottom of the first layer 141. Alternatively, the second, third, and fourth layers 142, 143, and 144 may be sequentially attached to the bottom of the first layer 141.

The second, third, and fourth layers 142, 143, and 144 may be attached to the bottom of the first layer 141 by a lamination process. The lamination process may be performed before the formation of the wiring layer 120 on the first layer 141.

Thereafter, the display device 400 is fabricated (S520). The display device 400 may be obtained by connecting the display panel 410 to one side of the semiconductor package 100 and connecting the driver PCB to the other side of the semiconductor package 100. A reel-to-reel process or a roll-to-roll process may be used to fabricate the display device 400.

Figure 15:
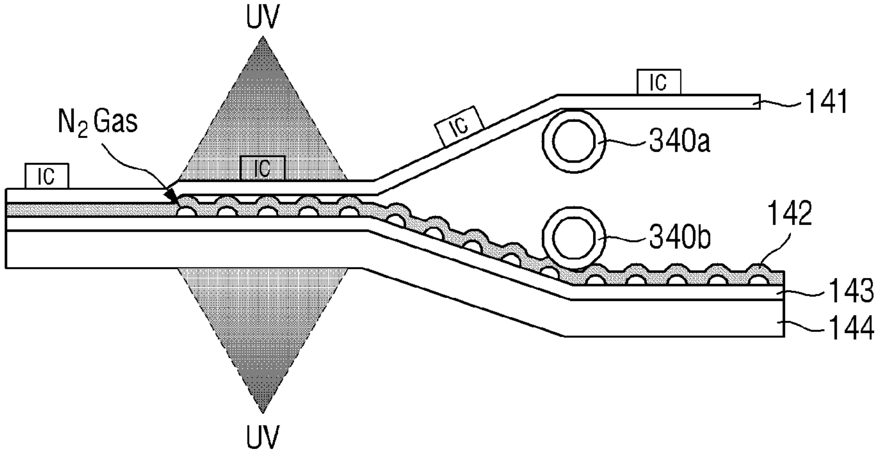
FIG. 15 illustrates the steps of applying light and peeling the second, third, and fourth layers 142, 143, and 144 off of the first layer 141.

Thereafter, light is applied to the film substrate 140 of the semiconductor package 100 (S530). The applied light may be UV light, as illustrated in FIG. 15. As the gas 310 included in the second layer 142 is foamed by UV light, the second, third, and fourth layers 142, 143, and 144 may be peeled off of the first layer 141 (S540) by a pair of rollers 340*a* and 340*b*, which are installed to be apart from each other.

One or more UV lamps emitting UV light may be installed above and/or below the film substrate 140. FIG. 15 illustrates the steps of applying light and peeling the second, third, and fourth layers 142, 143, and 144 off of the first layer 141.

Thereafter, the second, third, and fourth layers 142, 143, and 144, peeled off of the first layer 141, may be collected (S540).

While aspects of example embodiments have been particularly shown and described, it will be understood that various changes in form and details may be made therein without departing from the spirit and scope of the following claims.

What is claimed is:

1. A semiconductor package comprising:

a film substrate;

a wiring layer on the film substrate; and a semiconductor chip on the wiring layer and electrically connected to the wiring layer, wherein the film substrate comprises a first layer, wherein the first layer is an insulating layer having the wiring layer thereon, wherein the film substrate further comprises a second layer, wherein the second layer is in direct contact with a bottom of the first layer and comprises a gas, and wherein the second layer is configured to be peeled off of the first layer, wherein the film substrate further comprises a third layer comprising an adhesive layer attached to a bottom of the second layer, and wherein the film substrate further comprises a fourth layer comprising an insulating layer attached to a bottom of the third layer.

2. The semiconductor package of claim 1, wherein the gas is configured to foam when exposed to light.

3. The semiconductor package of claim 2, wherein the gas is an inert gas.

4. The semiconductor package of claim 2, wherein the light is ultraviolet (UV) light.

5. The semiconductor package of claim 2, wherein when the gas foams, the second layer is configured to be peeled off of the first layer.

6. The semiconductor package of claim 2, wherein the gas comprises at least 50% of a volume of the second layer.

7. The semiconductor package of claim 1, wherein the second layer is configured to be peeled off of the first layer when the semiconductor package is connected to an external device.

8. The semiconductor package of claim 1, wherein the first layer has a thickness in a range from 10 μm to 30 μm.

9. The semiconductor package of claim 1, wherein the third layer does not include the gas.

10. The semiconductor package of claim 1, wherein the second layer comprises an adhesive material.

11. The semiconductor package of claim 1, wherein the semiconductor package is connected to a display panel and is configured to convert and relay signals for controlling the display panel.

12. A film substrate, comprising:

a first layer comprising a first insulating layer, and a wiring layer and a semiconductor chip provided on the first layer;

a second layer attached to a bottom of the first layer and comprising a gas inside the second layer;

a third layer comprising an adhesive layer, attached to a bottom of the second layer; and a fourth layer comprising a second insulating layer, attached to a bottom of the third layer, wherein the second layer is configured to be peeled off of the first layer.

13. The film substrate of claim 12, wherein the gas is configured to foam when exposed to light.

* * * * *